United States Patent
Wei et al.

(10) Patent No.: US 12,010,875 B2
(45) Date of Patent: Jun. 11, 2024

(54) DISPLAY PANEL HAVING CATHODE LAYER ELECTRICALLY CONNECTED TO AUXILIARY CATHODE LAYER AND MANUFACTURING METHOD THEREOF

(71) Applicant: Shenzhen China Star Optoelectronics Semiconductor Display Technology Co., Ltd., Shenzhen (CN)

(72) Inventors: Feng Wei, Shenzhen (CN); Jinchuan Li, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/620,492

(22) PCT Filed: Nov. 8, 2019

(86) PCT No.: PCT/CN2019/116730
§ 371 (c)(1),
(2) Date: Dec. 7, 2019

(87) PCT Pub. No.: WO2021/082061
PCT Pub. Date: May 6, 2021

(65) Prior Publication Data
US 2022/0254845 A1  Aug. 11, 2022

(30) Foreign Application Priority Data
Oct. 29, 2019  (CN) .......................... 201911039942.X

(51) Int. Cl.
*H10K 59/122*  (2023.01)
*H10K 50/824*  (2023.01)
(Continued)

(52) U.S. Cl.
CPC .......... *H10K 59/122* (2023.02); *H10K 50/824* (2023.02); *H10K 71/00* (2023.02); *H10K 2102/103* (2023.02)

(58) Field of Classification Search
CPC .... H10K 59/122; H10K 71/00; H10K 50/824; H10K 2102/103
(Continued)

(56) References Cited

U.S. PATENT DOCUMENTS 11,329,246 B2 *  5/2022  Chen ...................... H10K 71/00
11,495,779 B2 *  11/2022  Hou ..................... H10K 59/173
(Continued)

FOREIGN PATENT DOCUMENTS

CN  104157675 A  11/2014
CN  104393188 A  3/2015
(Continued)

*Primary Examiner* — Eric W Jones
(74) *Attorney, Agent, or Firm* — PV IP PC; Wei Te Chung; Zhigang Ma

(57) ABSTRACT

A display panel and a method of manufacturing the display panel are disclosed. A pixel definition layer and an organic light-emitting layer are fabricated on a substrate provided with a first auxiliary cathode layer and a second auxiliary cathode layer. A connecting hole is formed on the pixel definition layer corresponding to the second auxiliary cathode layer. A solvent is printed in the connecting hole to allow the organic light-emitting layer to be dissolved around the connecting hole to the pixel definition layer, so that the second auxiliary cathode layer is exposed. A cathode layer is connected in parallel with the second auxiliary cathode layer and the first auxiliary cathode layer through the connecting hole.

9 Claims, 4 Drawing Sheets

(51) Int. Cl.
*H10K 71/00* (2023.01)
*H10K 102/10* (2023.01)

(58) Field of Classification Search
USPC .................................................. 257/40, 59
See application file for complete search history.

(56) References Cited

U.S. PATENT DOCUMENTS

| | | | |
|---|---|---|---|
| 2004/0183067 A1* | 9/2004 | Strip | H10K 59/86 |
| | | | 257/40 |
| 2005/0236629 A1 | 10/2005 | Lee et al. | |
| 2007/0048886 A1* | 3/2007 | Winters | H10K 50/824 |
| | | | 438/795 |
| 2016/0043341 A1* | 2/2016 | Heo | H10K 59/122 |
| | | | 438/23 |
| 2016/0093680 A1* | 3/2016 | Paek | H10K 50/805 |
| | | | 438/34 |
| 2016/0126304 A1* | 5/2016 | Cho | H10K 59/122 |
| | | | 438/23 |
| 2016/0359136 A1 | 12/2016 | Song | |
| 2017/0301740 A1* | 10/2017 | Goto | H10K 59/35 |
| 2018/0114818 A1 | 4/2018 | Paek et al. | |
| 2019/0081111 A1* | 3/2019 | Lee | H10K 50/824 |
| 2019/0273125 A1* | 9/2019 | Takechi | H10K 59/1213 |

FOREIGN PATENT DOCUMENTS

| | | |
|---|---|---|
| CN | 105470278 A | 4/2016 |
| CN | 106206673 A | 12/2016 |
| CN | 109004105 A | 12/2018 |
| KR | 20050027464 A | 3/2005 |

* cited by examiner

DISPLAY PANEL HAVING CATHODE LAYER ELECTRICALLY CONNECTED TO AUXILIARY CATHODE LAYER AND MANUFACTURING METHOD THEREOF

BACKGROUND OF INVENTION

1. Field of Invention

The present invention relates to a technical field of displays, and particularly to, a display panel and a manufacturing method thereof.

2. Related Art

Organic electroluminescent display panels are becoming a future development trend in display technology due to outstanding characteristics, such as high contrasts, wide color gamuts, quick response times, and flexibility.

The organic electroluminescent display panels are classified into a bottom emission and a top emission in terms of a light-emitting direction manner. The bottom emission cannot meet a high-resolution development demand of market products due to a problem of aperture ratio design. Therefore, technology for top emission organic light-emitting diode (OLED) devices must be developed. The top emission OLEDs have advantages of high resolutions and good optical performance of transparent cathodes, but the transparent cathodes still cannot meet technical requirements due to surface resistances and transmittance. In particular, large-sized OLED transparent cathodes have large surface resistances, and therefore a problem of poor display uniformity of organic electroluminescent display panels caused by a device voltage drop (IR-Drop) is serious.

As a result, it is imperative to overcome drawbacks existing in prior art.

SUMMARY OF INVENTION

The present application provides a display panel and a manufacturing method thereof to overcome a problem of poor display uniformity of current organic electroluminescent display panels caused by a voltage drop.

To overcome the above-mentioned problem, the present application provides a technical solution as follows:

The present application provides a display panel, comprising a substrate; an array layer disposed on the substrate; a patterned first auxiliary cathode layer disposed on the array layer; a planarization layer disposed on the first auxiliary cathode layer; a patterned second auxiliary cathode layer and an anode layer both disposed on the planarization layer, wherein the second auxiliary cathode layer is electrically connected to the first auxiliary cathode layer through a via hole; a pixel definition layer disposed on the second auxiliary cathode layer and provided with a pixel opening and a connecting hole corresponding to the second auxiliary cathode layer; an organic light-emitting layer disposed on the pixel definition layer, wherein the second auxiliary cathode layer is exposed to the connecting hole through the organic light-emitting layer; and a cathode layer disposed on the organic light-emitting layer and electrically connected to the second auxiliary cathode layer through the connecting hole.

In the display panel of the present application, each of the second auxiliary cathode layer and the first auxiliary cathode layer has a sheet resistance less than that of the cathode layer.

In the display panel of the present application, the cathode layer comprises a plurality of cathodes spaced apart from each other, wherein each of the cathodes is disposed corresponding to a pixel unit, and adjacent two of the cathodes are electrically connected to each other through the second auxiliary cathode layer and the first auxiliary cathode layer.

In the display panel of the present application, the first auxiliary cathode layer and a source/drain electrode of a thin-film transistor of the array layer are disposed on a same layer and are insulated from each other, and the first auxiliary cathode layer and the source/drain electrode are made of a same material.

In the display panel of the present application, the pixel definition layer comprises an organic light-emitting material infiltration portion corresponding to a peripheral area of the connecting hole, and the organic light-emitting material infiltration portion contains a material for formation of the organic light-emitting layer.

The present application further provides a method of manufacturing a display panel, the method comprising following steps:

S1: providing a substrate, and forming an array layer on the substrate, and a patterned first auxiliary cathode layer on the array layer;

S2: fabricating a planarization layer on the substrate, and forming a patterned auxiliary second cathode layer and a cathode layer both disposed on the planarization layer, wherein the second auxiliary cathode layer is electrically connected to the first auxiliary cathode layer through a via hole;

S3: fabricating a pixel definition layer on the second auxiliary cathode layer, and patterning the pixel definition layer to form a pixel opening corresponding to the anode layer, and a connecting hole corresponding to the second auxiliary cathode layer;

S4: fabricating an organic light-emitting layer on the pixel definition layer, and preparing a solvent for dissolving the organic light-emitting layer on a surface of the organic light-emitting layer corresponding to the connecting hole, dissolving the organic light-emitting layer corresponding to a location of the connecting hole by reaction of the solvent so that the organic light-emitting layer infiltrates into the pixel definition layer around the connecting hole, and exposing the second auxiliary cathode layer corresponding to the connecting hole;

S5: fabricating a cathode layer on the organic light-emitting layer, wherein the cathode layer is electrically connected to the second auxiliary cathode layer through the connecting hole.

In the manufacturing method of the present application, the solvent comprises one or more than one of toluenes, alcohols, and ketone solvents.

In the manufacturing method of the present application, step S4 further comprises: S41: fabricating the organic light-emitting layer on a complete surface of the pixel definition layer; S42: printing the solvent in the connecting hole using a printing method, dissolving the organic light-emitting layer in the connecting hole by the solvent, and forming an organic light-emitting material; and S43: performing a pumping and drying process on the organic light-emitting material.

In the manufacturing method of the present application, specifically, in step S42, the organic light-emitting material infiltrates into the pixel definition layer around the connecting hole to configure the pixel definition layer with an organic light-emitting material infiltration portion formed on a peripheral area of the connecting hole.

In the manufacturing method of the present application, each of the second auxiliary cathode layer and the first auxiliary cathode layer has a sheet resistance less than that of the cathode layer.

In order to overcome the above-mentioned problem, the present application further provides a display panel, comprising a substrate; an array layer disposed on the substrate; a patterned first auxiliary cathode layer disposed on the array layer; a planarization layer disposed on the first auxiliary cathode layer; a patterned second auxiliary cathode layer and an anode layer both disposed on the planarization layer, wherein the second auxiliary cathode layer is electrically connected to the first auxiliary cathode layer through a via hole; a pixel definition layer disposed on the second auxiliary cathode layer and provided with a pixel opening and a connecting hole corresponding to the second auxiliary cathode layer, wherein the connecting hole is disposed between adjacent two of the pixel openings; an organic light-emitting layer disposed on the pixel definition layer, wherein the second auxiliary cathode layer is exposed to the connecting hole through the organic light-emitting layer; and a cathode layer disposed on the organic light-emitting layer and electrically connected to the second auxiliary cathode layer through the connecting hole.

In the display panel of the present application, each of the second auxiliary cathode layer and the first auxiliary cathode layer has a sheet resistance less than that of the cathode layer.

In the display panel of the present application, the cathode layer comprises a plurality of cathodes spaced apart from each other, wherein each of the cathodes is disposed corresponding to a pixel unit, and adjacent two of the cathodes are electrically connected to each other through the second auxiliary cathode layer and the first auxiliary cathode layer.

In the display panel of the present application, the first auxiliary cathode layer and a source/drain electrode of a thin-film transistor of the array layer are disposed on a same layer and are insulated from each other, and the first auxiliary cathode layer and the source/drain electrode are made of a same material.

In the display panel of the present application, the pixel definition layer comprises an organic light-emitting material infiltration portion corresponding to a peripheral area of the connecting hole, and the organic light-emitting material infiltration portion contains a material for formation of the organic light-emitting layer.

The present application has advantageous effects as follows: based on a display panel and a method of manufacturing the display panel of the present application, an organic light-emitting layer in a connecting hole between the cathode layer and the second auxiliary cathode layer is dissolved by a solvent to make sure that a cathode layer is effectively electrically connected to auxiliary cathode layers. The present application utilizes the configuration of the auxiliary cathode layers to overcome a problem of poor display uniformity of current organic electroluminescent display panels caused by a voltage drop.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

The present application is provided to overcome a problem of poor display uniformity of current organic electroluminescent display panels caused by a voltage drop.

Figure 1:
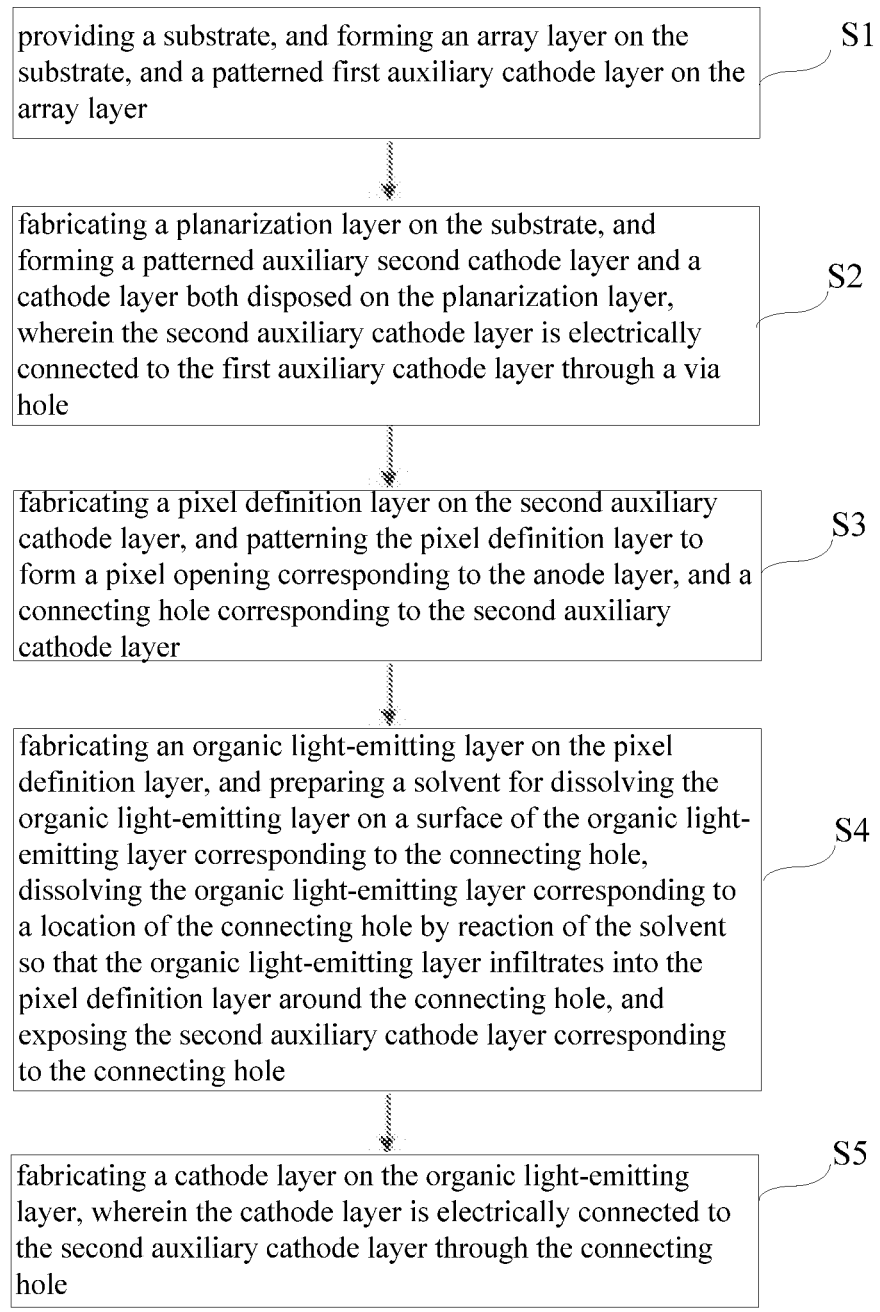
FIG. 1 is a flowchart showing a method of manufacturing a display panel of an embodiment of the present application.

As shown in FIG. 1, FIG. 1 is a flowchart showing a method of manufacturing a display panel of an embodiment of the present application. Please also refer to FIGS. 2A-2F. The method includes following steps:

S1: provide a substrate 10, and forming an array layer 20 on the substrate 10, and a patterned first auxiliary cathode layer 30 on the array layer 20.

Figure 2A:
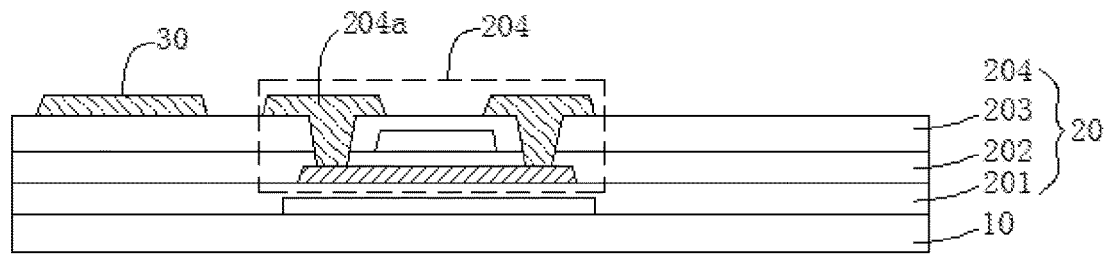
FIGS. 2A-2F are schematic views showing a display panel of an embodiment of the present application in a fabrication process.

As shown in FIG. 2A, the array layer 20 and the first auxiliary cathode layer 30 are fabricated on the substrate 10. The array layer 20 includes multi-layer inorganic film layers, such as a buffer layer 201, a gate insulating layer 202, and an interlayer dielectric layer 203 sequentially laminated on one another, and a thin-film transistor (TFT) 204 disposed in the multi-layer inorganic film layers.

In this embodiment, the first auxiliary cathode layer 30 and a source/drain electrode 204a of the TFT 204 are fabricated on a same layer and are insulated from each other. Specifically, the first auxiliary cathode layer 30 and the source/drain electrode 204a are made of a same material through a same mask process at the same time.

In one embodiment, the source/drain 204a and the first auxiliary cathode layer 30 may be a single-layered or multi-layered structure including a metal selected from at least one of aluminum (Al), platinum (Pt), palladium (Pd), silver (Ag), magnesium (Mg), gold (Au), Nickel (Ni), niobium (Nd), iridium (Ir), chromium (Cr), lithium (Li), calcium (Ca), molybdenum (Mo), titanium (Ti), tungsten (W) and copper (Cu).

In this embodiment, the first auxiliary cathode layer 30 includes one or more metals of copper (Cu) and silver (Ag).

In other embodiments, the first auxiliary cathode layer 30 is disposed between different layers of the array layer 20. For example, the first auxiliary cathode layer 30 is disposed between the buffer layer 201 and the gate insulating layer 202; alternatively, the first auxiliary cathode layer 30 is disposed between the gate insulating layer 202 and the interlayer dielectric layer 203, and the first auxiliary cathode layer 30 and a gate of the TFT 204 are made of a same material through a same mask process.

The gate may be a single-layered or multi-layered structure including a metal selected from at least one of aluminum (Al), platinum (Pt), palladium (Pd), silver (Ag), magnesium (Mg), gold (Au), Nickel (Ni), niobium (Nd), iridium (Ir), chromium (Cr), lithium (Li), calcium (Ca), molybdenum (Mo), titanium (Ti), tungsten (W) and copper (Cu).

S2: fabricate a planarization layer 40 on the substrate 10, and form a patterned auxiliary second cathode layer 50 and an anode layer 50' both disposed on the planarization layer 40, wherein the second auxiliary cathode layer 50 is electrically connected to the first auxiliary cathode layer 30 through a via hole.

Figure 2B:
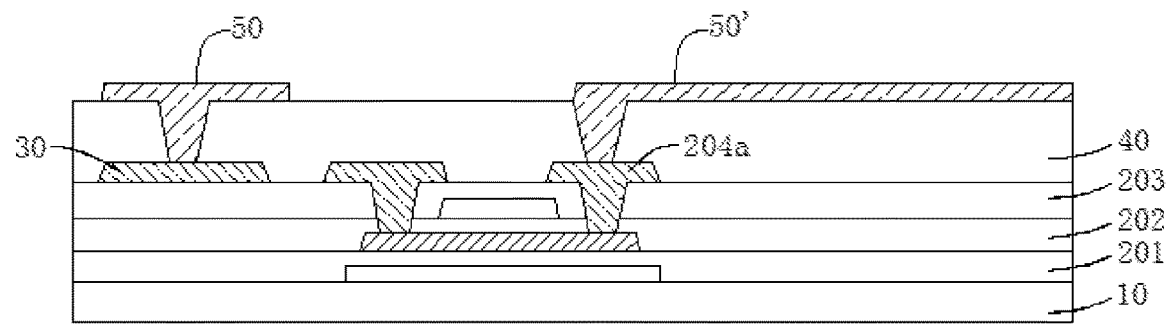

As shown in FIG. 2B, in this embodiment, the planarization layer 40 is formed on the first auxiliary cathode layer 30 and the planarization layer 40 is patterned to form via holes corresponding to the first auxiliary cathode layer 30 and the drain electrode 204a and extending through the planarization layer 40. Fabricate an electrode layer on the planarization layer 40 and forming the auxiliary second cathode layer 50 and an anode layer 50' insulated from each other after patterning. The second auxiliary cathode layer 50 is electrically connected to the first auxiliary cathode layer 30 through one of the via holes, and the cathode layer 50' is electrically connected to the drain electrode 204a through the other via hole.

In one embodiment, the electrode layer may be a single-layered or multi-layered structure including a metal selected from at least one of aluminum (Al), platinum (Pt), palladium (Pd), silver (Ag), magnesium (Mg), gold (Au), Nickel (Ni), niobium (Nd), iridium (Ir), chromium (Cr), lithium (Li), calcium (Ca), molybdenum (Mo), titanium (Ti), tungsten (W) and copper (Cu).

In another embodiment, the electrode layer may be made of a material selected from the group consisting of indium tin oxide (ITO), indium zinc oxide (IZO), zinc oxide (ZnO), indium oxide (In2O3), indium gallium oxide (IGO), and aluminum zinc oxide (AZO).

In this embodiment, the second auxiliary cathode layer 50 includes a metal of at least one of copper (Cu) and silver (Ag).

In another embodiment, the second auxiliary cathode layer 50 and the anode layer 50' may be formed by two masking processes. First, forming the patterned anode layer 50' on the planarization layer 40. The anode layer 50' includes, but not limited to, a material selected from the group consisting of indium tin oxide (ITO), indium zinc oxide (IZO), zinc oxide (ZnO), indium oxide (In2O3), indium gallium oxide (IGO), and aluminum zinc oxide (AZO). Then, the second auxiliary cathode layer 50 is fabricated to be insulated from the anode layer 50' on the planarization layer 40. The second auxiliary cathode layer 50 includes, but not limited to, at least one of copper (Cu) and silver (Ag).

S3: fabricate a pixel definition layer 60 on the second auxiliary cathode layer 50, and pattern the pixel definition layer 60 to form a pixel opening 601 corresponding to the anode layer 50' and a connecting hole 602 corresponding to the second auxiliary cathode layer 50.

Figure 2C:
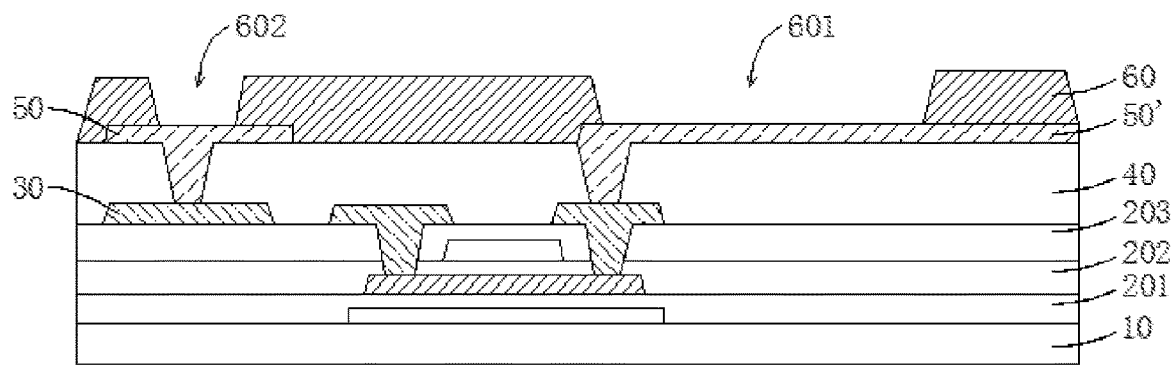

As shown in FIG. 2C, the pixel opening 601 and the connecting hole 602 are formed at the same time.

S4: fabricate an organic light-emitting layer 70 on the pixel definition layer 60, and prepare a solvent 100 for dissolving the organic light-emitting layer 70 on a surface of the organic light-emitting layer 70 corresponding to the connecting hole 602. The organic light-emitting layer 70 corresponding to a location of the connecting hole 602 is dissolved by reaction of the solvent 100 so that the organic light-emitting layer 70 infiltrates into the pixel definition layer 60 around the connecting hole 602, and exposes the second auxiliary cathode layer 50 corresponding to the connecting hole 602.

Figure 2D:
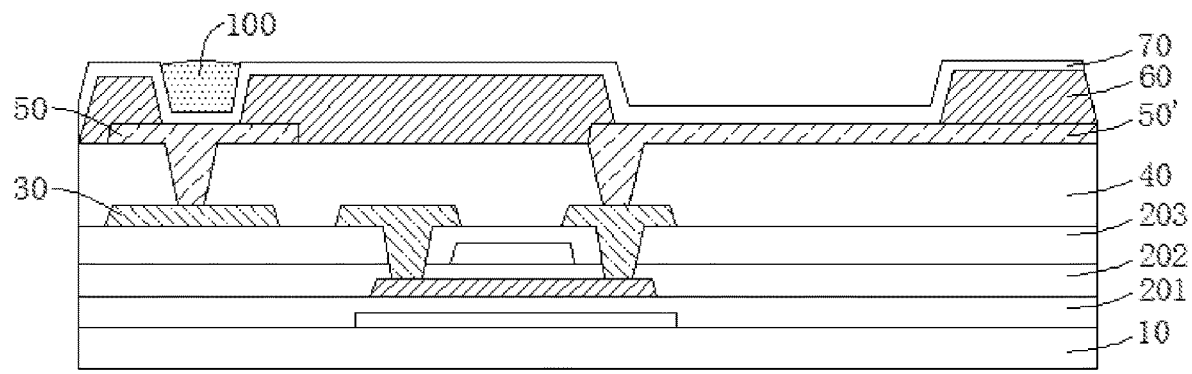
Figure 2E:
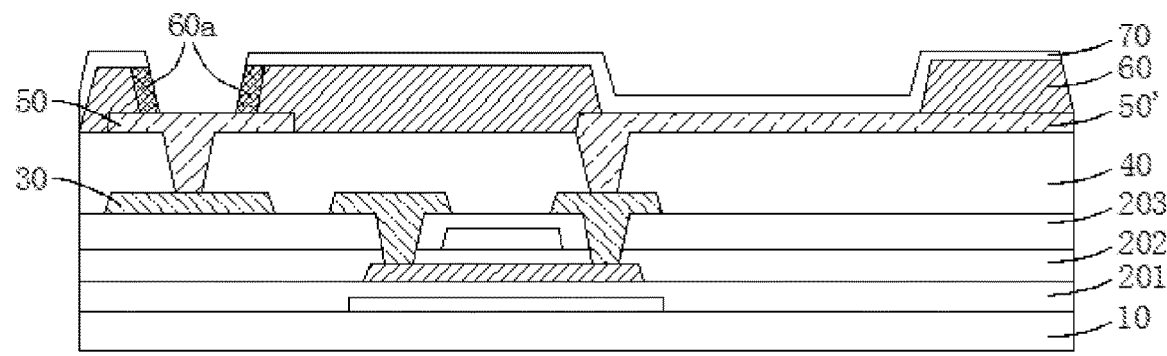

Please refer to FIGS. 2D-2E. A step S4 includes:

S41: fabricate the organic light-emitting layer 70 on a complete surface of the pixel definition layer 60.

Specifically, the organic light-emitting layer 70 is formed by evaporation using an open mask. The organic light-emitting layer 70 includes an electron blocking layer, a light-emitting layer, a hole blocking layer, an electron transport layer, and an electron injecting layer all sequentially disposed in a stack arrangement and formed by using a positive-air thermal evaporation organic material.

Since the organic light-emitting layer 70 is formed by using an open mask, the organic light-emitting layer 70 is also filled in the connecting hole 602. Because the organic light-emitting layer 70 is an insulating material, it may cause an insulating material existing between an auxiliary cathode layer (such as the second auxiliary cathode layer 50) and the cathode layer, thereby affecting conductivity between the auxiliary cathode layer and the cathode layer, and failing to effectively overcome a problem of pool displaying caused by a voltage drop in the cathode layer.

As a result, the organic light-emitting layer 70 in the connecting hole 602 must be removed.

S42: print the solvent 100 in the connecting hole 602 using a printing method, and dissolve the organic light-emitting layer 70 in the connecting hole 602 by the solvent 100 to form an organic light-emitting material.

The organic light-emitting layer 70 is made of a conventional material and is not limited thereto. The solvent 100 includes, but not limited to, at least one of chemical solvents, such as toluene, alcohols (e.g. ethylene glycol), and ketones (e.g. N-methylpyrrolidone). A specific selection of the solvent 100 may be determined according to a material of the organic light-emitting layer 70 as long as the organic light-emitting layer 70 can be dissolved by the solvent.

Since the pixel defining layer 60 is a hydrophilic material, the organic light-emitting material after being dissolved infiltrates into the pixel definition layer 60 from a periphery of the connecting hole 602, thereby forming an organic light-emitting material infiltration portion 60 a corresponding to the peripheral area of the connecting hole 602. The organic light-emitting layer 70 breaks off at the organic light-emitting material infiltration portion 60a of the pixel definition layer 60.

S43: perform a pumping and drying process on the organic light-emitting material.

After the organic light-emitting layer 70 is dissolved, the pumping and drying process is performed to remove the organic light-emitting material in the connecting hole 602 to expose the second auxiliary cathode layer 50 at a bottom of the connecting hole 602.

S5: fabricate a cathode layer 80 on the organic light-emitting layer 70, wherein the cathode layer 80 is electrically connected to the second auxiliary cathode layer 60 through the connecting hole 602.

Figure 2F:
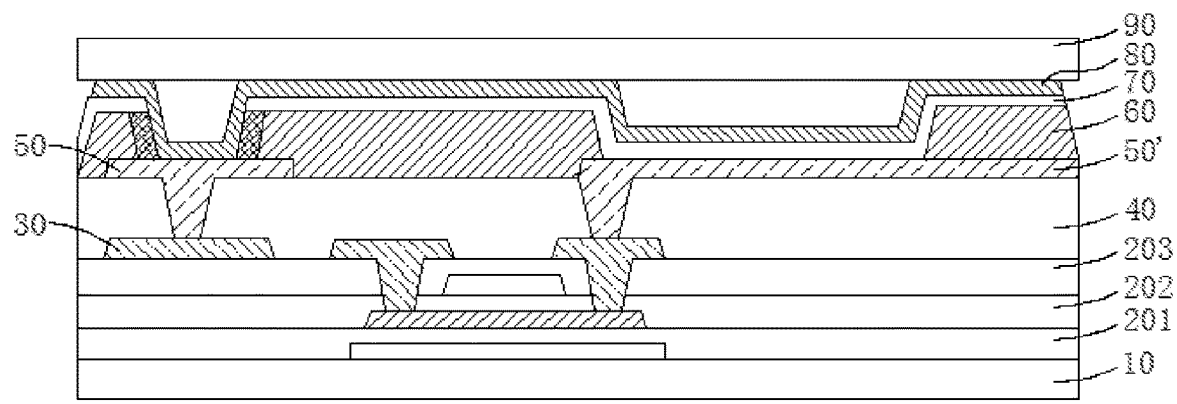

As shown in FIG. 2F, an encapsulation layer 90 is fabricated on the cathode layer 80.

In one embodiment, the cathode layer 80 may be a single-layered or multi-layered structure including a metal selected from at least one of aluminum (Al), platinum (Pt), palladium (Pd), silver (Ag), magnesium (Mg), gold (Au), Nickel (Ni), niobium (Nd), iridium (Ir), chromium (Cr), lithium (Li), calcium (Ca), molybdenum (Mo), titanium (Ti), tungsten (W) and copper (Cu).

In another embodiment, the cathode layer 80 may be made of a material selected from the group consisting of indium tin oxide (ITO), indium zinc oxide (IZO), zinc oxide (ZnO), indium oxide (In2O3), indium gallium oxide (IGO), and aluminum zinc oxide (AZO).

In this embodiment, the cathode layer 80 includes a metal of at least one of magnesium (Mg) and silver (Ag).

Based on the method of manufacturing the display panel of present application, the organic light-emitting layer 70 in the connecting hole 602 between the cathode layer 80 and the second auxiliary cathode layer 50 is dissolved by the solvent to make sure that the cathode layer 80 is effectively electrically connected to the second auxiliary cathode layer 50 and the first auxiliary cathode layer 30. The present application utilizes a configuration of the cathode layer 80 connected in parallel with the second auxiliary cathode layer 50 and the first auxiliary cathode layer 30 to reduce a voltage drop of the cathode layer 80 of the display panel, thereby improving display uniformity of the display panel.

Figure 3:
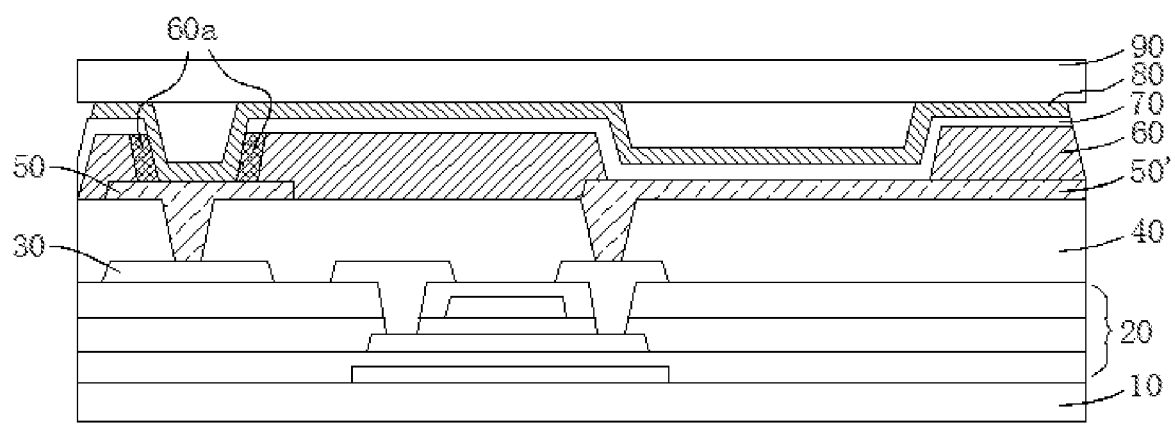
FIG. 3 is a schematic structural view of a display panel of an embodiment of the present application.

The present application further provides a display panel manufactured by the above-mentioned method. As shown in FIG. 3, the display panel includes: an array layer 20 disposed on a substrate 10; a patterned first auxiliary cathode layer 30 disposed on the array layer 20; a planarization layer 40 disposed on the first auxiliary cathode layer 30; a patterned second auxiliary cathode layer 50 and an anode layer 50' both disposed on the planarization layer 40, wherein the second auxiliary cathode layer 50 is electrically connected to the first auxiliary cathode layer 30 through a via hole; a pixel definition layer 60 disposed on the second auxiliary cathode layer 50 and provided with a pixel opening and a connecting hole corresponding to the second auxiliary cathode layer; an organic light-emitting layer 70 disposed on the pixel definition layer 60, wherein the second auxiliary cathode layer 50 is exposed to the connecting hole through the organic light-emitting layer 70; a cathode layer 80 disposed on the organic light-emitting layer 70 and electrically connected to the second auxiliary cathode layer 50 through the connecting hole; and an encapsulation layer 90 disposed on the cathode layer 80.

The connecting hole is disposed between adjacent two of the pixel openings, and the pixel definition layer 60 includes an organic light-emitting material infiltration portion 60a corresponding to a peripheral area of the connecting hole, and the organic light-emitting material infiltration portion 60a contains a material for formation of the organic light-emitting layer.

In this embodiment, each of the second auxiliary cathode layer 50 and the first auxiliary cathode layer 30 has a sheet resistance less than that of the cathode layer 80.

In this embodiment, the cathode layer includes a plurality of cathodes (not shown) spaced apart from each other, wherein each of the cathodes is disposed corresponding to a pixel unit, and adjacent two of the cathodes are electrically connected to each other through the second auxiliary cathode layer 50 and the first auxiliary cathode layer 30.

The display panel of the present application is configured to provide the cathode layer 80 connected in parallel with the second auxiliary cathode layer 50 and the first auxiliary cathode layer 30 to enable an overall resistance of the cathode layer 80, the second auxiliary cathode layer 50, and the first auxiliary cathode layer 30 to be less than a resistance of the cathode layer 80 itself, so that a voltage drop of the cathode layer 80 of the display panel can be reduced, thereby improving display uniformity of the display panel.

Accordingly, although the present application has been disclosed as a preferred embodiment, it is not intended to limit the present application. Those skilled in the art without departing from the scope of the present application may make various changes or modifications, and thus the scope of the present application should be after the appended claims and their equivalents.

What is claimed is:

1. A display panel, comprising:
   a substrate;
   an array layer disposed on the substrate;
   a patterned first auxiliary cathode layer disposed on the array layer;
   a planarization layer disposed on the first auxiliary cathode layer;
   a patterned second auxiliary cathode layer and an anode layer both disposed on the planarization layer, wherein the second auxiliary cathode layer is electrically connected to the first auxiliary cathode layer through a via hole;
   a pixel definition layer disposed on the second auxiliary cathode layer and provided with a pixel opening and a connecting hole corresponding to the second auxiliary cathode layer, wherein the pixel definition layer is a hydrophilic material;
   an organic light-emitting layer disposed on the pixel definition layer, wherein the second auxiliary cathode layer is exposed to the connecting hole through the organic light-emitting layer; and
   a cathode layer disposed on the organic light-emitting layer and electrically connected to the second auxiliary cathode layer through the connecting hole, wherein an entire inner surface of the connecting hole is covered by and completely directly contacts the cathode layer, and each of the second auxiliary cathode layer and the first auxiliary cathode layer has a sheet resistance lower than a sheet resistance of the cathode layer,
   wherein the pixel definition layer comprises an organic light-emitting material infiltration portion in a peripheral area of the connecting hole, and the organic light-emitting material infiltration portion contains a material for formation of the organic light-emitting layer.

2. The display panel of claim 1, wherein the cathode layer comprises a plurality of cathodes spaced apart from each other, wherein each of the cathodes is disposed corresponding to a pixel unit, and adjacent two of the cathodes are electrically connected to each other through the second auxiliary cathode layer and the first auxiliary cathode layer.

3. The display panel of claim 1, wherein the first auxiliary cathode layer and a source/drain electrode of a thin-film transistor of the array layer are disposed on a same layer and are insulated from each other, and the first auxiliary cathode layer and the source/drain electrode are made of a same material.

4. A display panel, comprising:
   a substrate;
   an array layer disposed on the substrate;
   a patterned first auxiliary cathode layer disposed on the array layer;
   a planarization layer disposed on the first auxiliary cathode layer;
   a patterned second auxiliary cathode layer and an anode layer both disposed on the planarization layer, wherein the second auxiliary cathode layer is electrically connected to the first auxiliary cathode layer through a via hole;
   a pixel definition layer disposed on the second auxiliary cathode layer and provided with a pixel opening and a connecting hole corresponding to the second auxiliary cathode layer, wherein the pixel definition layer is a hydrophilic material, and the connecting hole is disposed between adjacent two of the pixel openings;

an organic light-emitting layer disposed on the pixel definition layer, wherein the second auxiliary cathode layer is exposed to the connecting hole through the organic light-emitting layer; and a cathode layer disposed on the organic light-emitting layer and electrically connected to the second auxiliary cathode layer through the connecting hole, wherein an entire inner surface of the connecting hole is covered by and completely directly contacts the cathode layer, and each of the second auxiliary cathode layer and the first auxiliary cathode layer has a sheet resistance lower than a sheet resistance of the cathode layer, wherein the pixel definition layer comprises an organic light-emitting material infiltration portion in a peripheral area of the connecting hole, and the organic light-emitting material infiltration portion contains a material for formation of the organic light-emitting layer.

5. The display panel of claim 4, wherein the cathode layer comprises a plurality of cathodes spaced apart from each other, wherein each of the cathodes is disposed corresponding to a pixel unit, and adjacent two of the cathodes are electrically connected to each other through the second auxiliary cathode layer and the first auxiliary cathode layer.

6. The display panel of claim 4, wherein the first auxiliary cathode layer and a source/drain electrode of a thin-film transistor of the array layer are disposed on a same layer and are insulated from each other, and the first auxiliary cathode layer and the source/drain electrode are made of a same material.

7. A method of manufacturing a display panel, the method comprising following steps:
S1: providing a substrate, and forming an array layer on the substrate, and a patterned first auxiliary cathode layer on the array layer;
S2: fabricating a planarization layer on the substrate, and forming a patterned auxiliary second cathode layer and an anode layer both disposed on the planarization layer, wherein the second auxiliary cathode layer is electrically connected to the first auxiliary cathode layer through a via hole;
S3: fabricating a pixel definition layer on the second auxiliary cathode layer, and patterning the pixel definition layer to form a pixel opening corresponding to the anode layer and a connecting hole corresponding to the second auxiliary cathode layer, wherein the pixel definition layer is a hydrophilic material;
S4: fabricating an organic light-emitting layer on the pixel definition layer, and preparing a solvent for dissolving the organic light-emitting layer on a surface of the organic light-emitting layer corresponding to the connecting hole, dissolving the organic light-emitting layer corresponding to a location of the connecting hole by reaction of the solvent so that the organic light-emitting layer infiltrates into the pixel definition layer around the connecting hole, and exposing the second auxiliary cathode layer corresponding to the connecting hole; and
S5: fabricating a cathode layer on the organic light-emitting layer, wherein the cathode layer is electrically connected to the second auxiliary cathode layer through the connecting hole, an entire inner surface of the connecting hole is covered by and completely directly contacts the cathode layer, and each of the second auxiliary cathode layer and the first auxiliary cathode layer has a sheet resistance lower than a sheet resistance of the cathode layer, wherein step S4 further comprises:
S41: fabricating the organic light-emitting layer on a complete surface of the pixel definition layer;
S42: printing the solvent in the connecting hole using a printing method, dissolving the organic light-emitting layer in the connecting hole by the solvent, and forming an organic light-emitting material, wherein the organic light-emitting material infiltrates into the pixel definition layer around the connecting hole to configure the pixel definition layer with an organic light-emitting material infiltration portion formed in a peripheral area of the connecting hole.

8. The method of manufacturing the display panel of claim 7, wherein the solvent comprises one or more than one of toluenes, alcohols, and ketone solvents.

9. The method of manufacturing the display panel of claim 7, wherein step S4 further comprises:
S43: performing a pumping and drying process on the organic light-emitting material.

* * * * *